United States Patent
Coronel Arredondo et al.

(10) Patent No.: US 6,567,654 B1
(45) Date of Patent: May 20, 2003

(54) ELIMINATION OF SPURIOUS SIGNALS IN DOUBLE CONVERSION TUNER USING A DYNAMIC INTERMEDIATE FREQUENCY AND A PRESELECTED CRYSTAL REFERENCE FREQUENCY

(75) Inventors: David Coronel Arredondo, Irving, TX (US); Eduardo Enrrique Arguello Campos, Tijuana (MX)

(73) Assignee: Matsushita Electronic Components de Baja California, S.A. de C.V., Tijuana (MX)

( * ) Notice: Subject to any disclaimer, the term of this patent is extended or adjusted under 35 U.S.C. 154(b) by 0 days.

(21) Appl. No.: 09/437,455

(22) Filed: Nov. 10, 1999

(30) Foreign Application Priority Data

Oct. 28, 1999 (MX) .................................................. 999933

(51) Int. Cl.[7] .............................. H04B 1/26; H04N 5/50
(52) U.S. Cl. ....................... 455/315; 455/314; 455/296; 455/323; 348/735
(58) Field of Search ................................. 455/314, 315, 455/302, 296, 313, 334, 285, 255–258, 260, 165.1, 183.1, 131, 323, 324, 259; 348/731, 725, 732, 733, 735, 729

(56) References Cited

U.S. PATENT DOCUMENTS

| | | | | |
|---|---|---|---|---|
| 4,395,777 A | * | 7/1983 | Oki et al. ................. | 455/165.1 |
| 4,545,072 A | * | 10/1985 | Skutta et al. ............. | 455/183.2 |
| 4,551,856 A | * | 11/1985 | Victor et al. ............. | 455/165.1 |
| 4,672,308 A | * | 6/1987 | Leikus ....................... | 324/76.23 |
| 4,817,195 A | * | 3/1989 | Kubo et al. ................. | 348/735 |
| 5,311,318 A | * | 5/1994 | Dobrovolny ................. | 331/16 |
| 5,918,168 A | * | 6/1999 | Abe et al. ................... | 455/315 |
| 6,057,876 A | * | 5/2000 | Waight ....................... | 455/315 |
| 6,118,499 A | * | 9/2000 | Fang ......................... | 455/189.1 |
| 6,163,687 A | * | 12/2000 | Scott et al. ............... | 455/182.1 |

FOREIGN PATENT DOCUMENTS

JP 363073790 A * 4/1988

* cited by examiner

Primary Examiner—Vivian Chin
Assistant Examiner—Charles N. Appiah
(74) Attorney, Agent, or Firm—Gray Cary Ware & Freidenrich; Terrance A. Meador

(57) ABSTRACT

A double conversion tuner (DCT) free of spurious signals generated by the local oscillator frequencies and the crystal reference frequency is described herein. These spurious signals are generated by the first and/or second oscillator signals as well as by their harmonic frequencies. Spurious signals are also generated when the crystal reference frequency is not properly selected. In the past, complex-mechanical designs had to be used to isolate circuit blocks to reduce these spurious signals. By using a dynamic first intermediate frequency and/or selecting the value of the crystal reference frequency, these spurious signals can be reduced or eliminated.

7 Claims, 12 Drawing Sheets

Table that shows the results of the Flow Diagram when applied for many 1st IF & using the Fv of the USA (CATV Band) Channels.

1st IF Frequency Start=1390 MHz
1st IF Frequency Stop=1397 MHz
Step size (Increment 1st IF Value)=0.5 MHz
Max. Beat Count=10
2nd IF Output Frequency=45.75 MHz
2nd LO=1st IF − 2nd IF=1st IF −45.75
1st LO=1st IF + Fv

RESULTS

| | 1st IF | CHANNEL | BEAT FREQUENCY* | 1st LO HARMONIC NUMBER | 2nd LO HARMONIC NUMBER |
|---|---|---|---|---|---|
| 1 | 1390 | 37 | 2 | 4 | 5 |
| | | 55 | 4.25 | 6 | 8 |
| | | 90 | 3 | 6 | 9 |
| | | 93 | 2.25 | 4 | 6 |
| | | 100 | 0 | 2 | 3 |
| | | 120 | 3.5 | 5 | 8 |
| | | 131 | 0.25 | 3 | 5 |
| 2 | 1390.5 | 37 | 2.5 | 4 | 5 |
| | | 90 | 1.5 | 6 | 9 |
| | | 93 | 3.25 | 4 | 6 |
| | | 100 | 0.5 | 2 | 3 |
| | | 131 | −0.75 | 3 | 5 |
| 3 | 1391 | 37 | 3 | 4 | 5 |
| | | 90 | 0 | 6 | 9 |
| | | 93 | 4.25 | 4 | 6 |
| | | 100 | 1 | 2 | 3 |
| 4 | 1391.5 | 97 | 3.5 | 4 | 5 |
| | | 100 | 0.5 | 2 | 3 |
| 5 | 1392 | 37 | 4 | 4 | 5 |
| | | 100 | 2 | 2 | 3 |
| 6 | 1392.5 | 37 | 4.5 | 4 | 5 |
| | | 100 | 2.5 | 2 | 3 |
| 7 | 1393 | 88 | 4.5 | 2 | 3 |
| | | 100 | 3 | 2 | 3 |
| 8 | 1393.5 | 88 | 4 | 2 | 3 |
| | | 100 | 3.5 | 2 | 3 |
| 9 | 1394 | 98 | −1 | 9 | 10 |
| | | 88 | 3.5 | 2 | 3 |
| | | 100 | 4 | 2 | 3 |

*Beat Frequency=2nd IF − Beat**
**Beat=ABS((1st LO * 1st LO Harmonic Number)−(2nd LO * 2nd LO Harmonic Number))

FIGURE 3A

RESULTS

| | 6 | 7 | 8 | 9 | 10 |
|---|---|---|---|---|---|
| | 1st IF | CHANNEL | BEAT FREQUENCY* | 1st LO HARMONIC NUMBER | 2nd LO HARMONIC NUMBER |
| 10 | 1394.5 | 98 | -0.5 | 9 | 10 |
| | | 88 | 3 | 2 | 3 |
| | | 100 | 4.5 | 2 | 3 |
| 11 | 1395 | 98 | 0 | 9 | 10 |
| | | 88 | 2.5 | 2 | 3 |
| 12 | 1395.5 | 98 | 0.5 | 9 | 10 |
| | | 53 | 4.25 | 6 | 5 |
| | | 88 | 2 | 2 | 3 |
| | | 133 | 4.75 | 6 | 10 |
| 13 | 1396 | 98 | 1 | 9 | 10 |
| | | 53 | 3.25 | 6 | 8 |
| | | 88 | 1.5 | 2 | 3 |
| | | 133 | 2.75 | 6 | 10 |
| 14 | 1396.5 | 98 | 1.5 | 9 | 10 |
| | | 53 | 2.25 | 6 | 5 |
| | | 88 | 1 | 2 | 3 |
| | | 90 | 4.25 | 4 | 6 |
| | | 93 | 0 | 6 | 4 |
| | | 133 | 0.75 | 6 | 10 |
| 15 | 1397 | 98 | 2 | 9 | 10 |
| | | 9 | -1 | 6 | 7 |
| | | 53 | 1.25 | 6 | 8 |
| | | 88 | 0.5 | 2 | 3 |
| | | 90 | 3.25 | 4 | 6 |
| | | 93 | 1.5 | 6 | 9 |
| | | 132 | 4.25 | 3 | 5 |
| | | 133 | -1.25 | 6 | 10 |

USA, CATV BAND, CHANNEL.  Fv = Video Frequency
VIF 45.75 MHz, SIF 41.25 MHz  CH = CHANNEL

| CH | Fv | CH | Fv | CH | Fv | CH | Fv |
|---|---|---|---|---|---|---|---|
| 1 | 49.25 | 38 | 307.25 | 80 | 559.25 | 127 | 811.25 |
| 2 | 55.25 | 39 | 313.25 | 81 | 565.25 | 128 | 817.25 |
| 3 | 61.25 | 40 | 319.25 | 82 | 571.25 | 129 | 823.25 |
| 4 | 67.25 | 41 | 325.25 | 83 | 577.25 | 130 | 829.25 |
| 5 | 73.25 | 42 | 331.25 | 84 | 583.25 | 131 | 835.25 |
| 6 | 83.25 | 43 | 337.25 | 85 | 589.25 | 132 | 841.25 |
| 95 | 91.25 | 44 | 343.25 | 86 | 595.25 | 133 | 847.25 |
| 96 | 97.25 | 45 | 349.25 | 87 | 601.25 | 134 | 853.25 |
| 97 | 103.25 | 46 | 355.25 | 88 | 607.25 | | |
| 98 | 109.25 | 47 | 361.25 | 89 | 613.25 | | |
| 99 | 115.25 | 48 | 367.25 | 90 | 619.25 | | |
| 14 | 121.25 | 49 | 373.25 | 91 | 625.25 | | |
| 15 | 127.25 | 50 | 379.25 | 92 | 631.25 | | |
| 16 | 133.25 | 51 | 385.25 | 93 | 637.25 | | |
| 17 | 139.25 | 52 | 391.25 | 94 | 643.25 | | |
| 18 | 145.25 | 53 | 397.25 | 100 | 649.25 | | |
| 19 | 151.25 | 54 | 403.25 | 101 | 655.25 | | |
| 20 | 157.25 | 55 | 409.25 | 102 | 661.25 | | |
| 21 | 163.25 | 56 | 415.25 | 103 | 667.25 | | |
| 22 | 169.25 | 57 | 421.25 | 104 | 673.25 | | |
| 7 | 175.25 | 58 | 427.25 | 105 | 679.25 | | |
| 8 | 181.25 | 59 | 433.25 | 106 | 685.25 | | |
| 9 | 187.25 | 60 | 439.25 | 107 | 691.25 | | |
| 10 | 193.25 | 61 | 445.25 | 108 | 697.25 | | |
| 11 | 199.25 | 62 | 451.25 | 109 | 703.25 | | |
| 12 | 205.25 | 63 | 457.25 | 110 | 709.25 | | |
| 13 | 211.25 | 64 | 463.25 | 111 | 715.25 | | |
| 23 | 217.25 | 65 | 469.25 | 112 | 721.25 | | |
| 24 | 223.25 | 66 | 475.25 | 113 | 727.25 | | |
| 25 | 229.25 | 67 | 481.25 | 114 | 733.25 | | |
| 26 | 235.25 | 68 | 487.25 | 115 | 739.25 | | |
| 27 | 241.25 | 69 | 493.25 | 116 | 745.25 | | |
| 28 | 247.25 | 70 | 499.25 | 117 | 751.25 | | |
| 29 | 253.25 | 71 | 505.25 | 118 | 757.25 | | |
| 30 | 259.25 | 72 | 511.25 | 119 | 763.25 | | |
| 31 | 265.25 | 73 | 517.25 | 120 | 769.25 | | |
| 32 | 271.25 | 74 | 523.25 | 121 | 775.25 | | |
| 33 | 277.25 | 75 | 529.25 | 122 | 781.25 | | |
| 34 | 283.25 | 76 | 535.25 | 123 | 787.25 | | |
| 35 | 289.25 | 77 | 541.25 | 124 | 793.25 | | |
| 36 | 295.25 | 78 | 547.25 | 125 | 799.25 | | |
| 37 | 301.25 | 79 | 553.25 | 126 | 805.25 | | |

FIGURE 8

ELIMINATION OF SPURIOUS SIGNALS IN DOUBLE CONVERSION TUNER USING A DYNAMIC INTERMEDIATE FREQUENCY AND A PRESELECTED CRYSTAL REFERENCE FREQUENCY

TECHNICAL FIELD OF APPLICATION

This invention relates to elimination of spurious signals in double conversion tuners by dynamic selection of the frequency of a first IF signal and selection of a crystal frequency. Such operation reduces or eliminates interference caused by spurious signals generated by the combination of first and second local oscillator frequencies and their harmonics, as well as by changes to the crystal reference frequency.

BACKGROUND OF THE INVENTION

In double conversion tuners, two mixers are used to convert an incoming signal into a predetermined intermediate frequency (IF) output signal called the IF output. Each mixer must use a local oscillator (LO) to tune a desired channel. Each LO produces a local oscillator signal of a certain frequency. The frequency of each LO signal is controlled by a frequency synthesizer circuit which in turn is controlled by means of digital words provided by an external controller. The first mixer receives a group of incoming signals that are combined with the first-LO signal to select one of the incoming channels and convert it to a first IF signal. This first IF signal is then passed through a second mixer that receives a second LO signal from a second LO to convert the first IF signal into a second IF signal. The second IF signal is filtered and amplified to produce the IF output.

Conventionally, double conversion tuners use a first IF signal with a fixed frequency for the entire range of input channels. The frequency of this first IF signal is determined in different ways. For example, in order to avoid image frequencies, it is frequently convenient to set the first IF signal to as high a frequency as possible. Currently, there are on the market many double conversion tuners and it can be said that almost every manufacturer has selected a first IF signal frequency that is considered to be optimum or proper to a particular tuner design because of cost, topology, and circuit limitations.

A double conversion tuner has many sections, any of them can generate spurious signals that cause interference with tuner operation if not properly isolated or filtered. Either (or both) of the local oscillators (LO) can produce spurious signals, when an LO signal or its harmonics are combined with other signals. Some of the spurious signals can be generated by the crystal oscillator. External signals can also generate spurious signals in a tuner when they combine with preexisting spurious signals. Generally any or all of the above-described spurious signals are undesirable and, if possible, should be reduced or eliminated to enhance tuner operation.

The following equations describe the two types of spurious signals which cause most of the interference with tuner operation.

Equation (1) describes the spurious signals generated by the local oscillators:

$$\text{Spurious Signal} = ABS((\text{first } LO \text{ frequency} * n) - (\text{second } LO \text{ frequency} * n)) \quad (1)$$

Where:

$n = 1, 2, 3, 4, 5, 6, 7, \ldots$

ABS=Mathematical Absolute Value *=Multiplier symbol

Equations (2) & (3) describe two kinds of interference generated by the crystal reference frequency:

$$\text{Spurious Signal} = IF \text{ output} - Xtl \quad (2)$$

$$\text{Spurious Signal} = IF \text{ output} - (Fch_1 - Fch_2 - Xtl) \quad (3)$$

Where, for equation (2) and equation (3):

IF output=second intermediate frequency (IF) signal.

$Fch_{1,2}$=video frequency of the channel.

Xtl=crystal reference frequency.

SUMMARY OF THE INVENTION

It is a technical advantage of the present invention to provide techniques to reduce or eliminate spurious signals in the bandwidth of the IF output signal of a double conversion tuner. As mentioned before, conventional double conversion tuners have a fixed first IF value. Moreover, the second LO signal frequency in such conventional tuners is the same for all the tunable input channels. If the first IF signal frequency becomes dynamic then it is possible to select a specific first IF frequency per channel in such way as to eliminate the possible combinations between the harmonics of the first LO signal and the second LO signal that can cause an interference in the bandwidth of the IF output signal. The invention is embodied in this dynamic IF technique. For example, according to the invention, on an NTSC system, the bandwidth of the IF output signal includes those frequencies whose values are greater than or equal to a second IF signal frequency −4.75 MHz and are less than or equal to a second IF signal frequency +1.25 MHz; other system standards have different bandwidths.

Most of the double conversion tuners use a 4 Mhz crystal reference frequency. If the crystal reference frequency modulates the IF output signal then spurious signals might appear in the bandwidth of the IF output signal. The invention is further embodied in a technique to move spurious signals from the bandwidth of the IF output signal by selection of a crystal reference frequency such that, when the crystal reference frequency is tested according to equations (2) & (3), the result is outside the IF output bandwidth.

Hereinafter, the following definitions are used:

"IF output bandwidth" - Bandwidth of the IF output signal;

"first IF" - The IF signal produced by the first mixer;

"second IF" - The signal produced by the second mixer;

"first LO signal" - The signal produced by the first LO;

"second LO signal" - The signal produced by the second LO;

"IF output bandwidth" - The bandwidth of the IF output signal produced by the tuner.

BRIEF DESCRIPTION OF THE DRAWINGS.

FIG. 8 is a table of the USA, CATV band channels. This table can be used as a reference for the examples illustrated in FIGS. 3–7.

DESCRIPTION OF THE PREFERRED EMBODIMENTS

Figure 1:
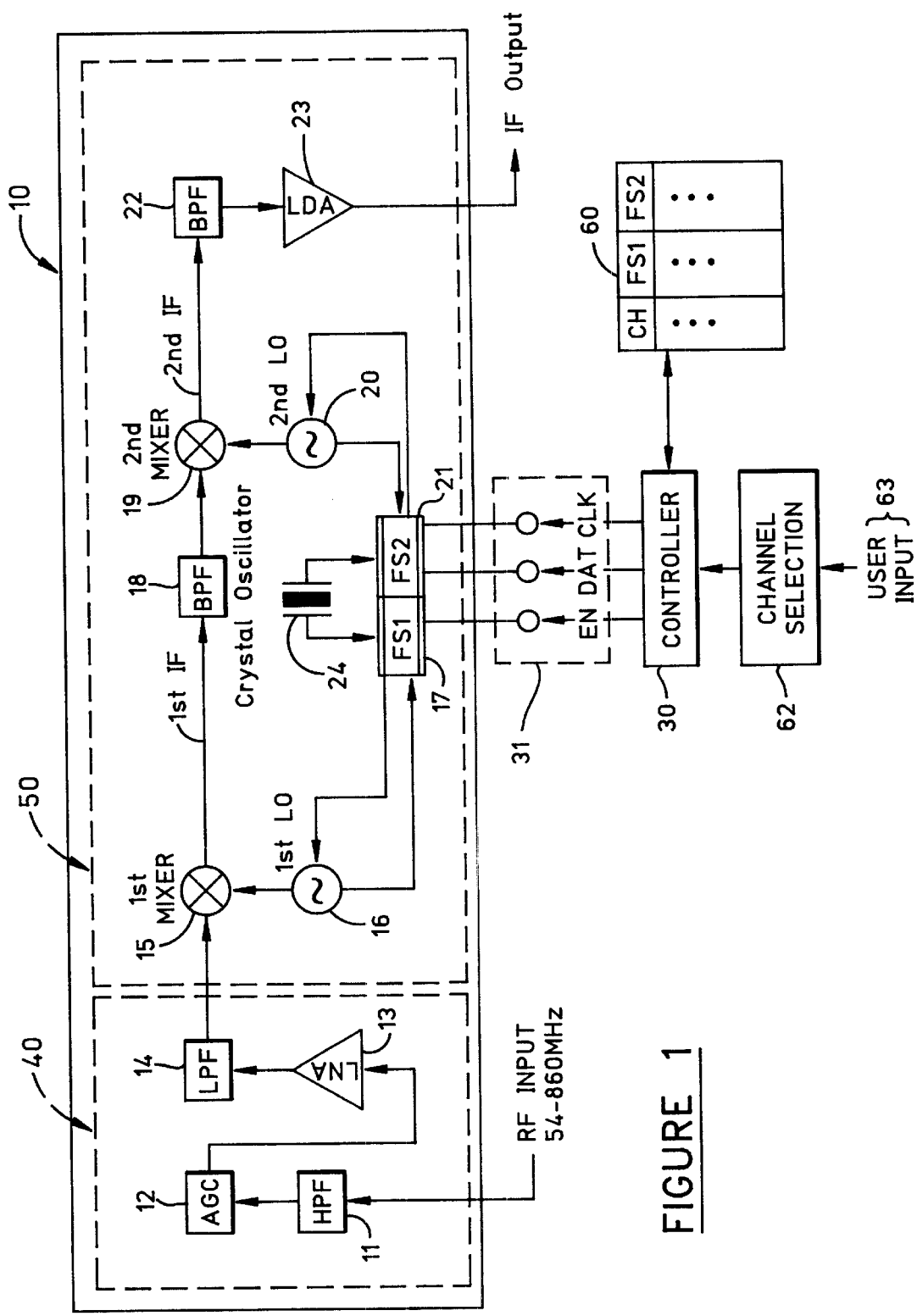
FIG. 1 is a simplified block diagram of a double conversion tuner according to this invention.

FIG. 1 shows a simplified block diagram of a double conversion tuner 10 according to this invention. RF signals are input to the tuner 10 through a high pass filter (HPF) 11 to eliminate RF signals below the lowest desired RF signal frequency. In order to keep the total gain of the tuner 10 in a predetermined range of values, an automatic gain control (AGC) circuit 12 is used. One of the most important parameters for the tuner 10 is the noise figure, which is the amount of noise added by the tuner 10 to the noise existing at its input. To achieve good noise performance, a low noise amplifier (LNA) 13 is connected to the output of the AGC 12. As those skilled in the art will appreciate, the LNA 13 should be carefully designed, otherwise its performance might degrade the composite second order (CSO) performance of the tuner 10 by increasing second order distortions. After amplification by the LNA 13, the RF signal passes through a low pass filter (LPF) 14 that is connected to the output of the LNA 13. The main function of the LPF 14 is to attenuate leakage from the first local oscillator (LO) 16.

A first mixer 15 is connected to the output of the LPF 14 and the output of the first LO 16. The first mixer 15 receives both the RF signal from the LPF 14 and a first LO signal produced by the first LO 16 and generates an output signal, which may be called the first IF. In the prior art, the first IF had a fixed single frequency for all the tunable input channels. In the tuner 10 of this invention, the first IF can be selectively set to any value necessary to reduce or eliminate the injection of spurious signals into the tuner's IF output bandwidth. Accordingly, the frequency of the signal produced by the first LO 16 is controlled by a first frequency synthesizer (FS1) 17 which is, in turn, controlled by an external controller 30 by way of a digital interface 31 (i.e. I²C, 3 wires, etc.). The synthesizer 17 produces a first frequency-determining signal that is provided to the first LO 16; the magnitude of the first frequency-determining signal is set by a word provided on the digital interface 31 of the controller 30.

The first IF, generated by the first mixer 15, is connected through the output of the first mixer 15 through a band pass filter (BPF) 18, which attenuates undesired signals (such as the image frequency). The output of the BPF 18 is connected to a second mixer 19. Once the first IF generated by the first mixer 15 has been filtered, it is mixed with a second local oscillator (LO) signal generated by a second local oscillator (LO) 20, whose output (the second LO signal) is connected to the second mixer 19. The second mixer 19 operates to generate an output signal, which may be called the second IF signal. The frequency of the signal produced by the second LO 20 is controlled by a second frequency-determining signal produced by a second frequency synthesizer (FS2) 21 which is also controlled by a word from the external controller 30 through the above-mentioned digital interface 31. The output of the second mixer 19 is connected to a second band pass filter (BPF) 22. The second BPF 22 reduces the interference injected into the second IF signal by those channels that are adjacent to the tuned channel. Finally, the output of the second BPF 22 is connected to a low distortion amplifier (LDA) 23. The LDA 23 is utilized to achieve the required amplitude level of the signal. The output of the LDA 23 provides the IF output produced by the tuner 20.

A crystal oscillator 24 provides a reference frequency for the frequency synthesizers 17 and 21. The frequency synthesizers operate conventionally to derive the frequency-determining signals in response to the crystal reference frequency. In the prior art, the frequency of a double conversion tuner crystal oscillator is typically 4 MHz. In the tuner 10 of this invention, the frequency of the crystal oscillator 24 is 12 MHz so that any spurious signal caused by the crystal oscillator is moved out of the IF output bandwidth.

Manifestly, the external controller 30, by way of the frequency synthesizers 17 and 21, enables the frequency of the first IF generated by the first mixer 15 to be varied dynamically, or selected, in order to solve the problem of spurious signal generation at certain channel values that characterize the prior art double conversion tuners. The frequency of the first IF may be selected, for example, according to the following descriptions.

FIG. 1 illustrates a preferred embodiment and illustrative example of a double conversion tuner according to the invention. As FIG. 1 shows, a double conversion tuner that embodies this invention might be provided in two modules, each module comprising, for example, a respective printed circuit board with appropriate shielding for installation and operation in an appliance. In modularized form, the first (front end) module 40 can be provided with any electronic architecture appropriate to preparing a multi-channel signal for input into the second (tuner) module 50. In this regard, the front end module 40 would be configured as appropriate for a specific application such as high definition television (HDTV) equipment, and cable terminal equipment such as modems, cable television (CTV) equipment, and so on. It is expected that the blocks in the front end module 40 would be changed according to the application, while the elements in the tuner module 50 would be common for any application. Of course, it is contemplated that the double conversion tuner of this invention could also be provided as a single module including a first, conditioning section, corresponding to the front end module 40 and a second, tuning section, corresponding to the tuning module 50.

Figure 2:
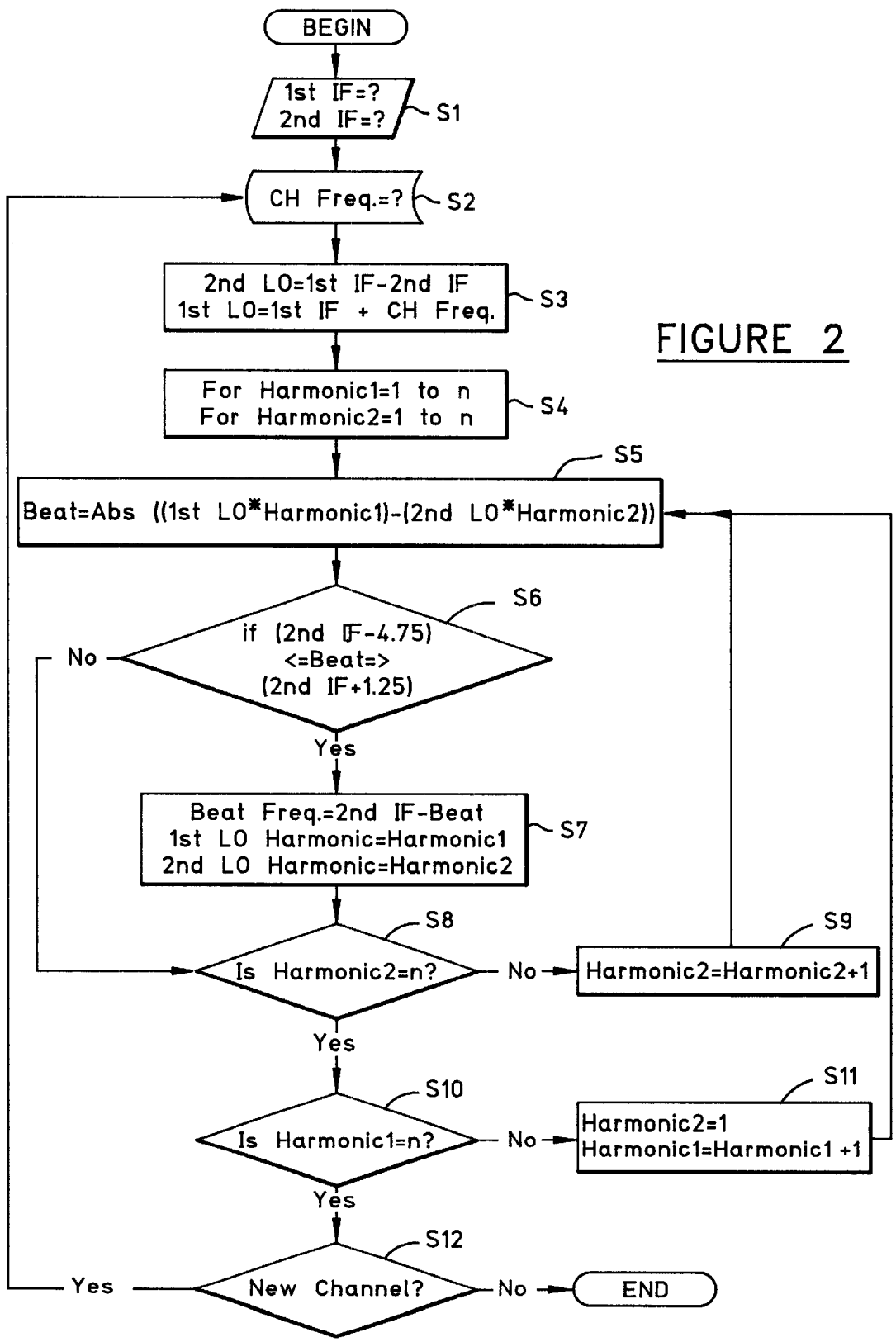
FIG. 2 is a flow diagram that can be implemented in a computer program to predict spurious signals generated by a double conversion tuner.

In a preferred embodiment of this invention, the frequencies of the first IF are selected based on a prediction of the quantity of channels that could experience interference from spurious signals when a determined first IF frequency is used. FIG. 2 illustrates a process to predict if a selected first IF frequency will produce spurious signals and what harmonic frequencies will cause the spurious signals. This figure illustrates a computer program that may be used for this prediction. Of course, the program may be written in an appropriate language, compiled, and executed by a general-purpose digital computer. Alternatively, the process may be executed by a dedicated, special purpose processor. In the first step S1, the frequencies of the first IF and the second IF are received. With reference to an example set forth in FIG. 3, the frequency of the second IF is 45.75 MHz. In steps S2 and S12, an input channel frequency (CH Freq) is received. In the preferred embodiment, the input channel frequency is provided to the procedure from a database. Thus, when the process is executing, it will calculate the spurious signals for all the channels of a determined channel band, (i.e. USA-CATV Band-Channels, USA-Air Band-Channels, Japan-Air-Band Channels, etc). Next, in step S3 the frequency of the first LO signal and the frequency of the second LO signal are calculated. In this invention, the frequency of the second LO signal is equal to the frequency of the first IF minus the frequency of the second IF. The frequency of the first LO signal is equal to the frequency of the first IF plus the frequency of a specified channel's video frequency (Fv), in the figure this value is denoted as CH Freq. Next, in step S4 it is necessary to decide how many harmonics will be used to calculate the.spurious signals. For the example in FIG. 3, only the first ten harmonics of the local oscillators 16 and 20 will be used, although more or fewer may be used according to specific design requirements. The next steps are: a) calculate all the spurious signals in steps S5, S8, S9, S10, S11; b) determine what spurious signals are in the IF output bandwidth (step S6); c) indicate in step S7 (by display, for example) the spurious signals that are in the IF output bandwidth as being the same as the harmonic numbers that cause each spurious signal.

Figures 3, 3B:
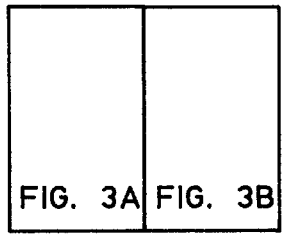
FIG. 3 is a table that shows an example of results produced by a computer program that implements the flow diagram of FIG. 2.

An easy way to calculate the spurious signals of many first IF frequencies using the process of FIG. 2 does not require the indication of the frequency of a first IF. Instead, a first IF start frequency, a first IF stop frequency and the value of step size are input to the process. By doing this, all the frequencies of the first IF that the user wants to evaluate can be calculated. First, the process calculates the spurious signals using the first IF start frequency as the first IF value. Then, the process calculates the spurious signal values using the first IF start frequency plus the step size as the first IF value; this procedure continues until the first IF value is equal to the first IF stop frequency. Representative results produced by a computer program using the process described above are shown in FIG. 3. For the example in FIG. 3, the first IF start frequency is 1390 MHz, the first IF stop frequency is 1397 MHz and the step size is 0.5 MHz. FIG. 3 shows the spurious signals calculated for a set of first IF frequencies. In the figure, columns 1 and 6 are, the set of the first IF frequencies. Columns 2 and 7 list the channels that have spurious signals. Columns 3 and 8 list the frequencies where the spurious signals are located; those frequencies are referred from the second IF signal. Columns 4 and 9 list the numbers of the first LO signal harmonics, which cause the spurious signals. Columns 5 and 10 list the numbers of the second LO signal harmonics, which cause the spurious signals. For example, in row 4 the first IF, with frequency equal to 1391.5 MHz, has only two channels with spurious signals: channel 37 and channel 100. The spurious signals of channels 37 & 100 are located +3.5 MHz and +1.5 MHz, respectively, from the second IF frequency. The spurious signal of channel 37 is generated by the combination of the fourth harmonic of the first LO signal and the fifth harmonic of the second LO signal; while the spurious signal of channel 100 is generated by the combination of the second harmonic of the first LO signal and the third harmonic of the second LO signal. However, in row 11 where the first IF is equal to 1395 MHz, there are only two channels with spurious signals: channel 98 and channel 88. The spurious signals of channels 98 & 88 are located +0.0 MHz & +2.5 MHz, respectively, from the second IF frequency. The spurious signal of channel 98 is generated by the combination of the ninth harmonic of the first LO signal and the tenth harmonic of the second LO signal; while the spurious signal of channel 88 is generated by the combination of the second harmonic of the first LO signal and the third harmonic of the second LO signal.

Figure 4:
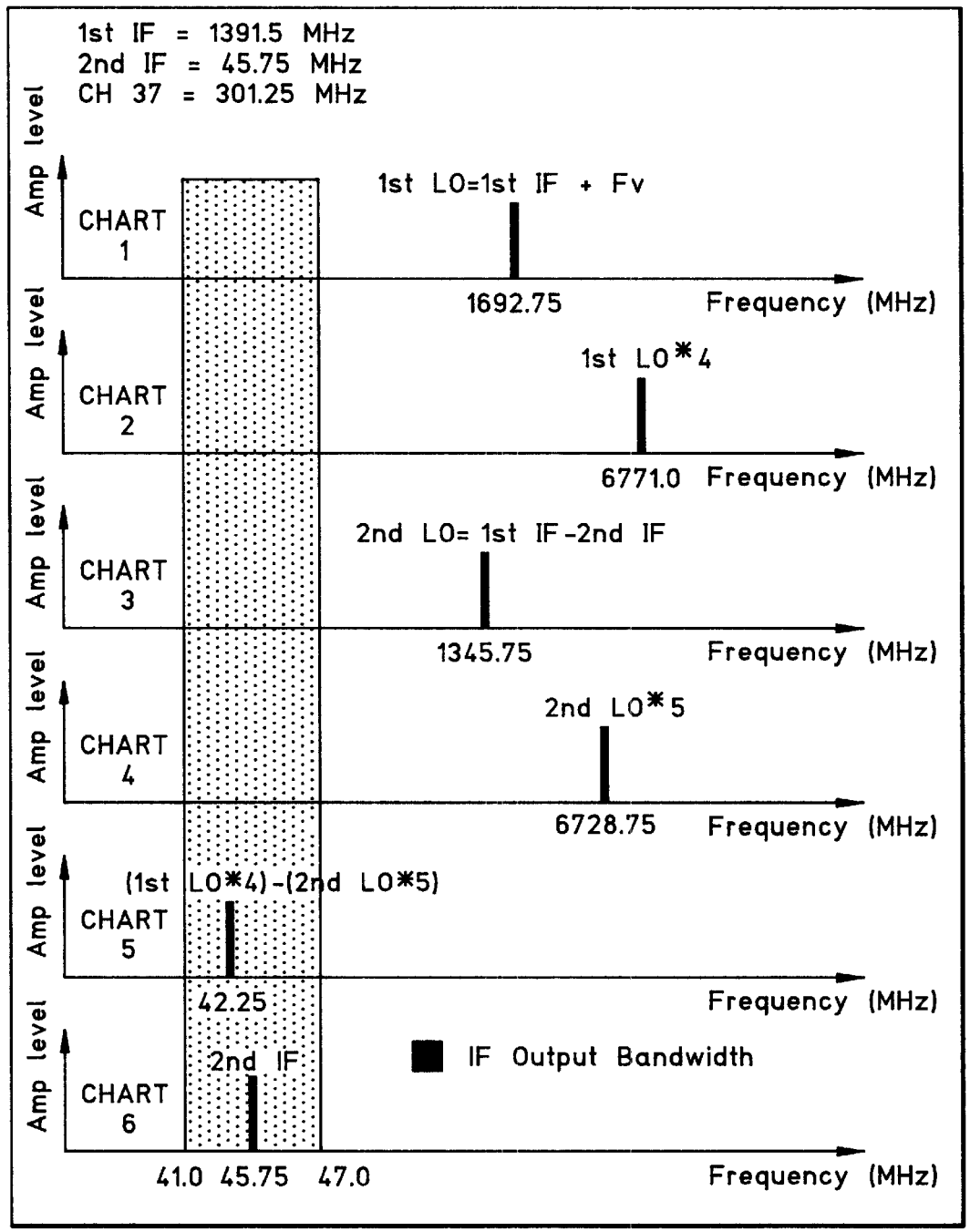
FIG. 4 is a chart that illustrates how spurious signals are generated by LO operation in a double conversion tuner and how those spurious signals cause interference in the IF output bandwidth of the tuner.
Figure 5:
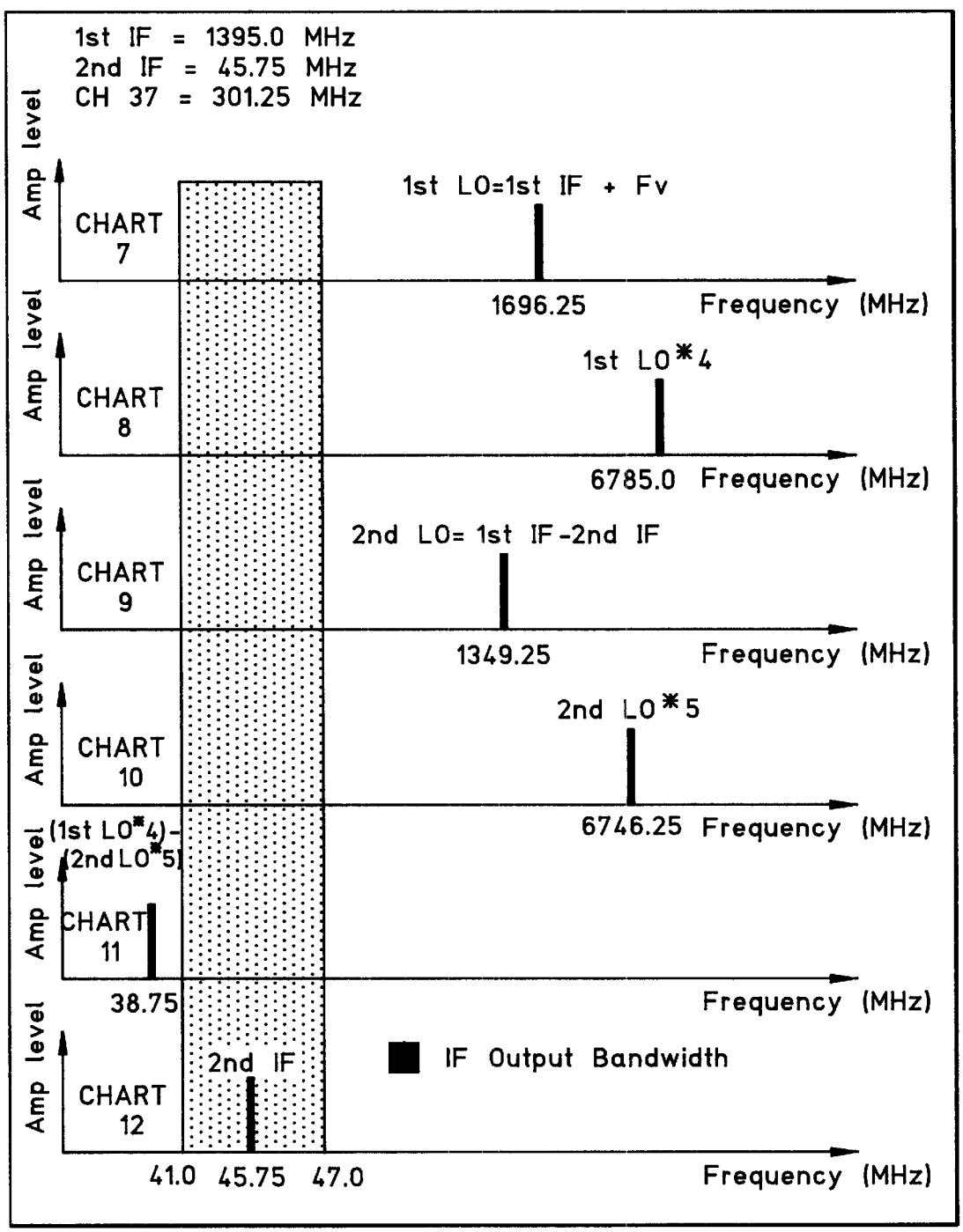
FIG. 5 is a variation of the chart of FIG. 4; this figure illustrates the same mechanism as FIG. 4 but uses a different first IF value.

As an example of the dynamic IF technique of this invention, one could design a double conversion tuner where the frequency of the first IF was 1391.5 MHz for all channels except channels 37 & 100. For those channels the first IF frequency could be set to 1395 MHz. Thus, by using two or more frequencies for the first IF, the spurious signals generated by LO operation would be eliminated for all channels. Refer now to FIGS. 4 and 5, which illustrate the generation by LO operation of spurious signals for channel 37 (US, CATV) with a first frequency for the first IF signal (FIG. 4) and a second frequency for the first IF signal (FIG. 5). In these figures the IF output bandwidth is illustrated by the gray band extending vertically across all of the charts. FIG. 4 illustrates how spurious signals for channel 37 are generated. Chart 1 shows the first LO signal frequency, which depends on the first IF frequency, which typically can vary between 1 GHz & 1.5 GHz. For the example, assume that the first IF frequency is 1391.5 MHz. In accord with FIG. 3, the harmonic number of the first LO signal that causes a spurious signal is four; this harmonic is illustrated in chart 2. Chart 3 shows the second LO signal frequency, which also depends on the first IF frequency. The harmonic number of the second LO signal that causes a spurious signal is five; this harmonic is illustrated in chart 4. Chart 5 shows the spurious signal as a combination of the fourth harmonic of the first LO signal, chart 2, and the fifth harmonic of the second LO signal, chart 4. Chart 6 shows the IF output bandwidth and the location of the video carrier (IF output).

FIG. 5 illustrates how a spurious signal for channel 37 is generated, but with a different frequency for the first IF than the frequency in FIG. 4. Chart 7 shows the first LO signal frequency when the frequency of the first IF is 1395 MHz; the video frequency (Fv) for channel 37 depends on the band of channels being used. For the example, the band of channels may be the USA CATV band, which is shown in FIG. 8. Chart 8 shows the fourth harmonic for the first LO signal. Chart 9 shows the second LO signal frequency. Chart 10 shows the fifth harmonic for the second LO frequency. Chart 11 shows the spurious signal as a combination of the fourth harmonic of the first LO frequency, chart 8, and the fifth harmonic of the second LO frequency, chart 10. Chart 12 shows the IF output bandwidth and the location of the video carrier. The gray area extends across all charts so it is easy to determine the spurious signals. As illustrated in chart 12, there are no spurious signals for channel 37 in the IF output bandwidth when the first IF frequency is 1395 MHz.

Figure 6:
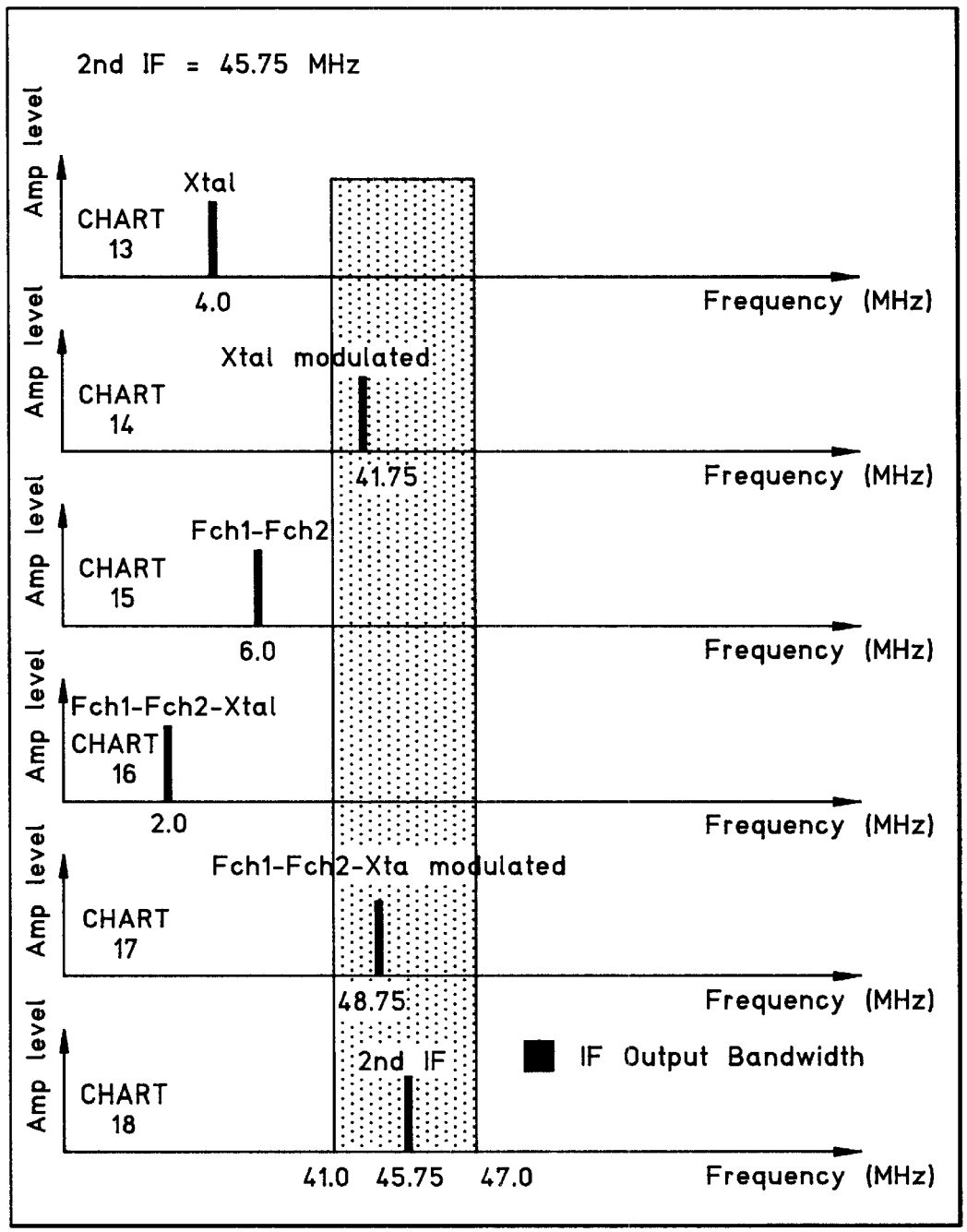
FIG. 6 is a chart that illustrates how spurious signals are generated by crystal operation in a double conversion tuner and how those spurious signals cause interference in the IF output bandwidth of the tuner.
Figure 7:
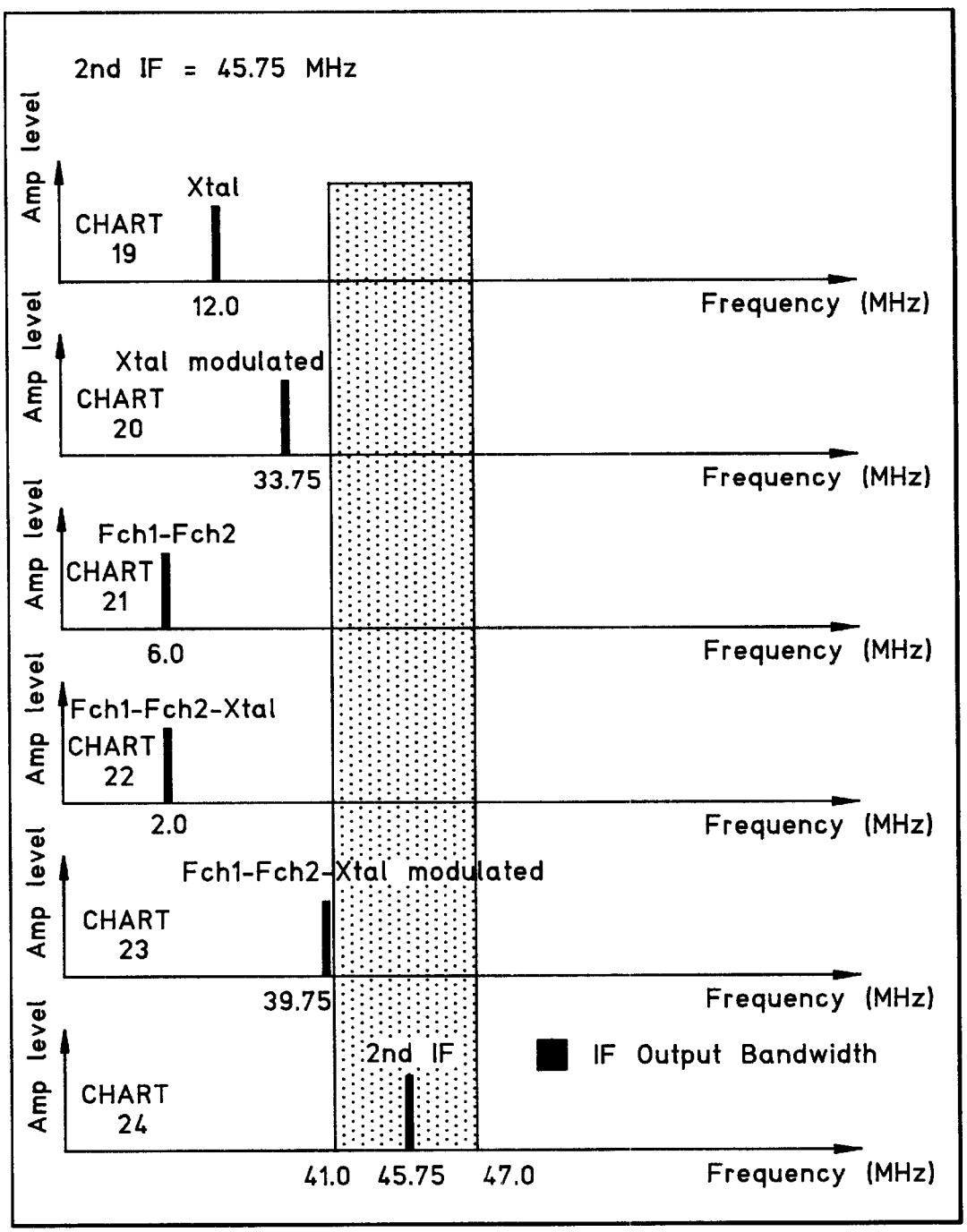
FIG. 7 is a variation of the chart of FIG. 6; this figure illustrates the same mechanism as FIG. 6 but uses a different crystal reference frequency.

Refer now to FIGS. 6 and 7, which illustrate the generation of spurious signals due to crystal operation. In these figures, the IF output bandwidth is illustrated by the gray band extending vertically across all of the charts. FIG. 6 illustrates how spurious signals are generated by operation of the crystal at a first crystal reference frequency (4 MHz). Chart 13 shows the crystal reference frequency. Then, chart 14 shows the crystal reference frequency modulating the IF output, i.e. 45.75 MHz minus 4 MHz. The result is one of the two crystal spurious signals. Chart 15 illustrates the result of subtracting the video frequency of two adjacent channels; as an example, the result of the video frequency of channel two, 55.25 MHz, minus the video frequency of channel three, 61.25 MHz, is 6 MHz. Chart 16 shows how a second crystal spurious signal is generated from the difference of these two adjacent channels, 6 MHz, minus the crystal reference frequency, 4 MHz, the result being 2 MHz. Chart 17 shows the 2 MHz frequency modulating the second IF. Chart 18 illustrates the IF output bandwidth and the location of the video carrier.

FIG. 7 illustrates how the crystal spurious signals are generated, with selection of a different crystal reference frequency than FIG. 6. Chart 19 illustrates a crystal reference frequency of 12 MHz. Chart 20 illustrates the crystal reference frequency modulating the IF output. By using this greater value for the crystal reference frequency, the crystal spurious signal has been moved out of the IF output bandwidth. Chart 21 illustrates the same result as chart 15 since the difference between the adjacent channels is almost always the same, i.e. 6 MHz. Chart 22 illustrates how the second crystal spurious signal is generated when the crystal reference frequency is subtracted from the difference of the two adjacent channels, i.e. 12 MHz - 6 MHz=6 MHz in this case. Chart 23 shows how, with the new value for the crystal reference frequency, the second crystal spurious signal was moved out of the IF output bandwidth. Chart 24 illustrates the IF output bandwidth and the location of the video carrier.

The inventive subject matter included in the discussion above in respect of FIGS. 2–8 can be implemented in a channel selection combination that may be understood with reference once again to FIG. 1. In FIG. 1 a table 60 contains a sequence of entries, each having at least three fields: CH, FS1, FS2. These fields define corresponding columns of the table 60. The table 60 is indexed in the first column (CH) by a channel number. For any particular application, the CH column will contain the channels that may be tuned using the double conversion tuner. Each of the columns FS1 and FS2 contain digital words that are necessary to cause the FS1 17 and FS2 21 to operate the first and second LOs 16 and 20 at frequencies that reduce or eliminate the generation of spurious signals by LO operation by the IF output bandwidth. Thus, for example, in a CTV appliance such as a set top box, a modem, or a set, a conventional channel selection module 62 receives user inputs 63 indicative of either a desired channel, or of a change in channel (up or down). The number of the indicated channel is provided to the controller 30, which uses the number to index into the table 60 and to obtain therefrom the words out of the FS1 and FS2 columns that control the FS1 17 and FS2 21, respectively in such a way as to reduce or eliminate the generation of spurious signals in the IF output bandwidth. It should be evident that the table 60 may be implemented as a programmable or programmed device incorporated into the structure of an appliance that uses the double conversion tuner of FIG. 1 to tune a channel. In addition, the frequency of operation of the crystal oscillator 24 is selected in order to realize the benefit of the teachings of this invention by keeping spurious signals generated by oscillator operation outside of the IF output bandwidth.

Figure 9:
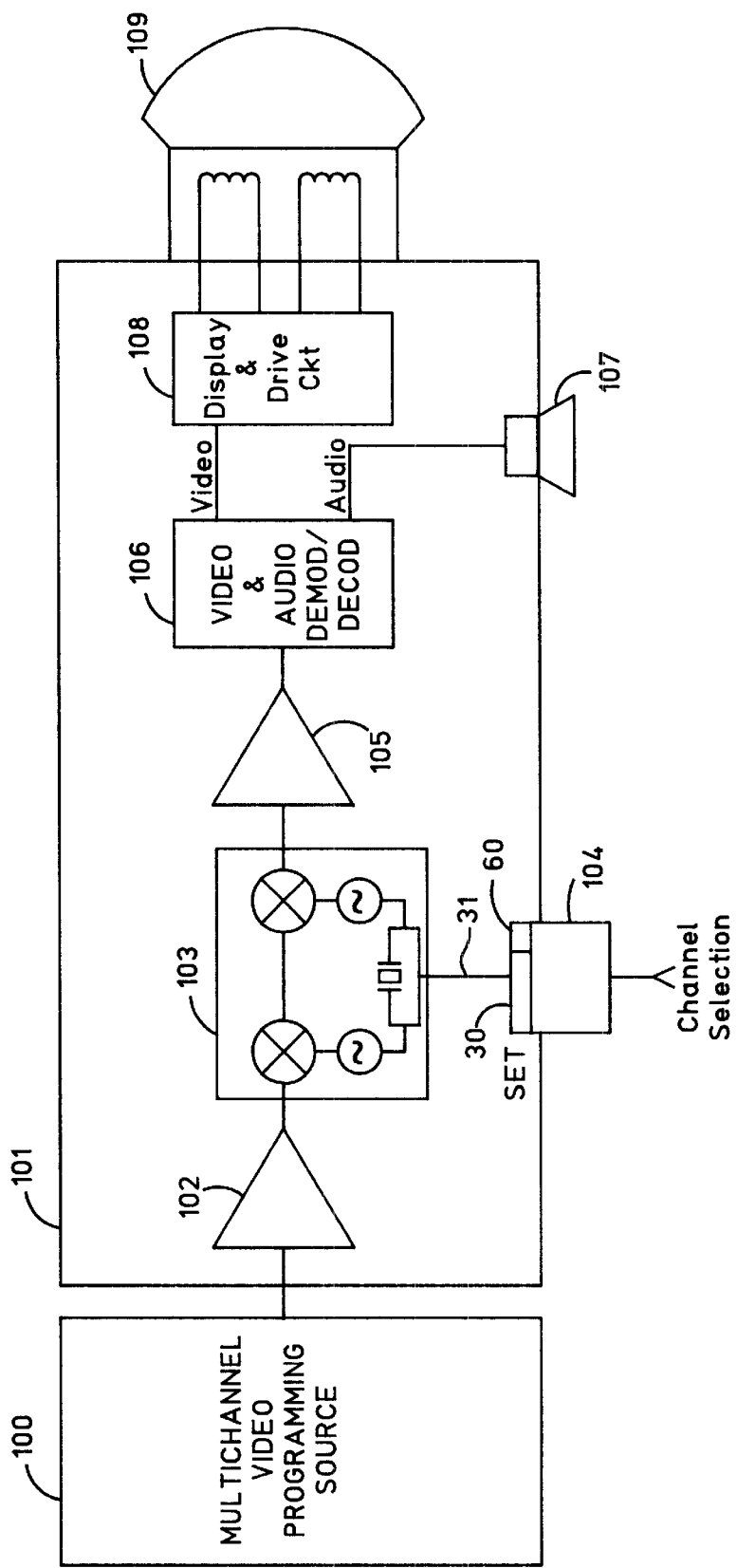
FIG. 9 is a block diagram of a multi-channel display system incorporating a double conversion tuner according to the invention.

The invention may be included or otherwise embodied in a display system having a multi-channel source and a tuning capacity. For example, the cable television (CTV) system illustrated in FIG. 9 includes a source 100 of a multi-channel signal that is provided to an apparatus such as the CTV set 101. The set 101 includes a double conversion tuner 103 according to this invention which enables a user to select a desired channel from the multi-channel signal provided by the source 100. The user operates a channel selector 104 by conventional means, for example, either by a remote control device, or by buttons or knobs on the set 101. For convenience, the controller 30 and table 60 of FIG. 1 are incorporated into the block representing the channel selector 104; this is for illustration only, it being understood that these elements may be located wherever convenient to the design and operation of the set 101. The dual conversion tuner 102 includes at least first and second mixing sections and a crystal oscillator in which the frequency of the LO signals and the frequency of the crystal oscillator are selected and established according to the teachings of this invention. The set 101 receives a multi-channel signal from the multi-channel source 100 and amplifies the signal at 102. The amplified signal is provided to the tuner 103, which extracts a channel from the signal, providing the IF output which is amplified at 105. The amplified IF output is provided to video and audio demodulation and decoding circuitry 106, which extracts an audio signal (Audio) fed to one or more speakers 107, and a video signal (Video) that is provided to display electronics and drive circuitry 108 which operates a display device such as the cathode ray tube (CRT) 109 to provide a visual output embodying video programming information in the selected channel.

Figure 10:
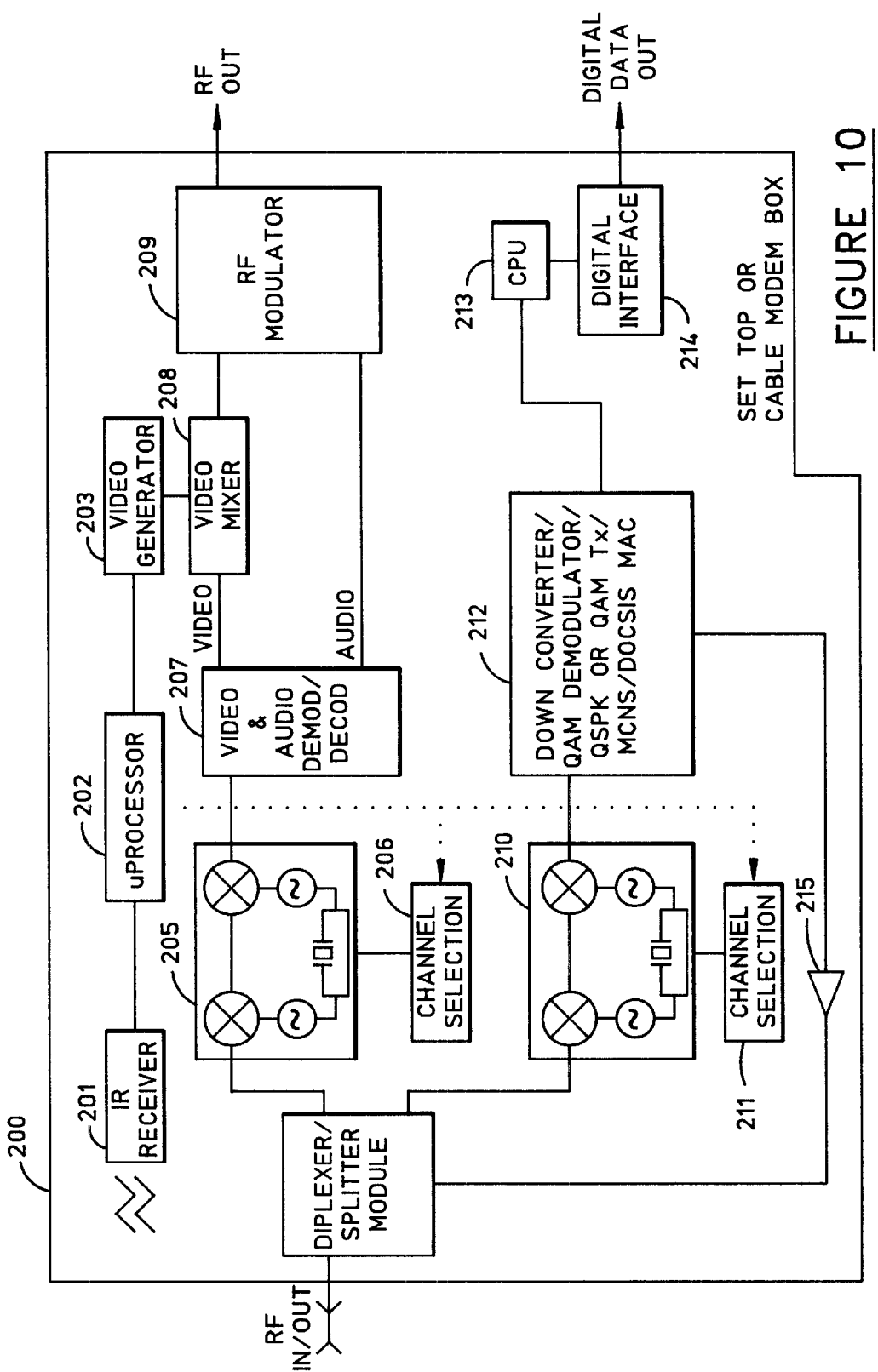
FIG. 10 is a block diagram of an appliance such as a set top or cable modem box incorporating a double conversion tuner according to the invention.

FIG. 10 shows another application of the double conversion tuner in an appliance such as a set top or cable modem box 200. The appliance 200 incorporates two double conversion tuners according to this invention; the tuners are indicated by reference numerals 205 and 210. This application is representative of appliances that may use more than-one tuner according to this invention. The replicated tuner design of the appliance illustrated in FIG. 10 represents a set top box that provides an analog RF output (RF OUT) and a cable modem box, providing a digital data output (Digital Data Out). FIG. 10 therefore illustrates a simplified block diagram of a single set top/cable modem box 200.

In the appliance of FIG. 10, a multi-channel RF signal is received at a diplexer/splitter module 204, which separates signals into a higher band, for example 54–860 MHz, and a lower band, for example 5–42 MHz. The signals in the higher band are split between a first double conversion tuner 205 and a second double conversion tuner 210. The first double conversion tuner 205 tunes any desired channel in accord with information received from a channel selection circuit 206, which in turn receives channel selection information from a microprocessor 202. The microprocessor 202 receives user input from a receiver 201, which may be an infrared (IR) receiver. A user provides information to the receiver 201 by, for example, an IR transmitter such as would be found in a remote control device. The IF output of the tuner 205 is provided to a video and audio demodulator/decoder 207, which delivers video and audio base band signals. The video signal is mixed by a video mixer 208, which also receives other video signals from a video generator 203. The video generator 203 creates video signals for screen functions such as clock, menus, etc. The microprocessor 202 provides the required screen function to the video generator 203. An RF modulator 209 receives the audio and mixed video base band signals and converts those signals into a single RF signal. A portion of the high band signals provided to the second tuner 210 will tune any desired channel in accord with information received from a channel selection circuit 211 which, in turn, receives information identifying a desired channel from the microprocessor 202.

The IF output of the tuner 210 is provided through an integrated circuit 212 which incorporates and performs many standard functions including down conversion of the IF output signal, demodulation of quadrature amplitude modulated (QAM) information and transmission information modulated in QAM or QSPK. The integrated circuit 212 may also include a media access controller (MAC). The output of the integrated circuit 212 is provided to a central processor unit (CPU) 213, which drives a digital interface 214 that delivers the digital data output signal.

Figure 11:
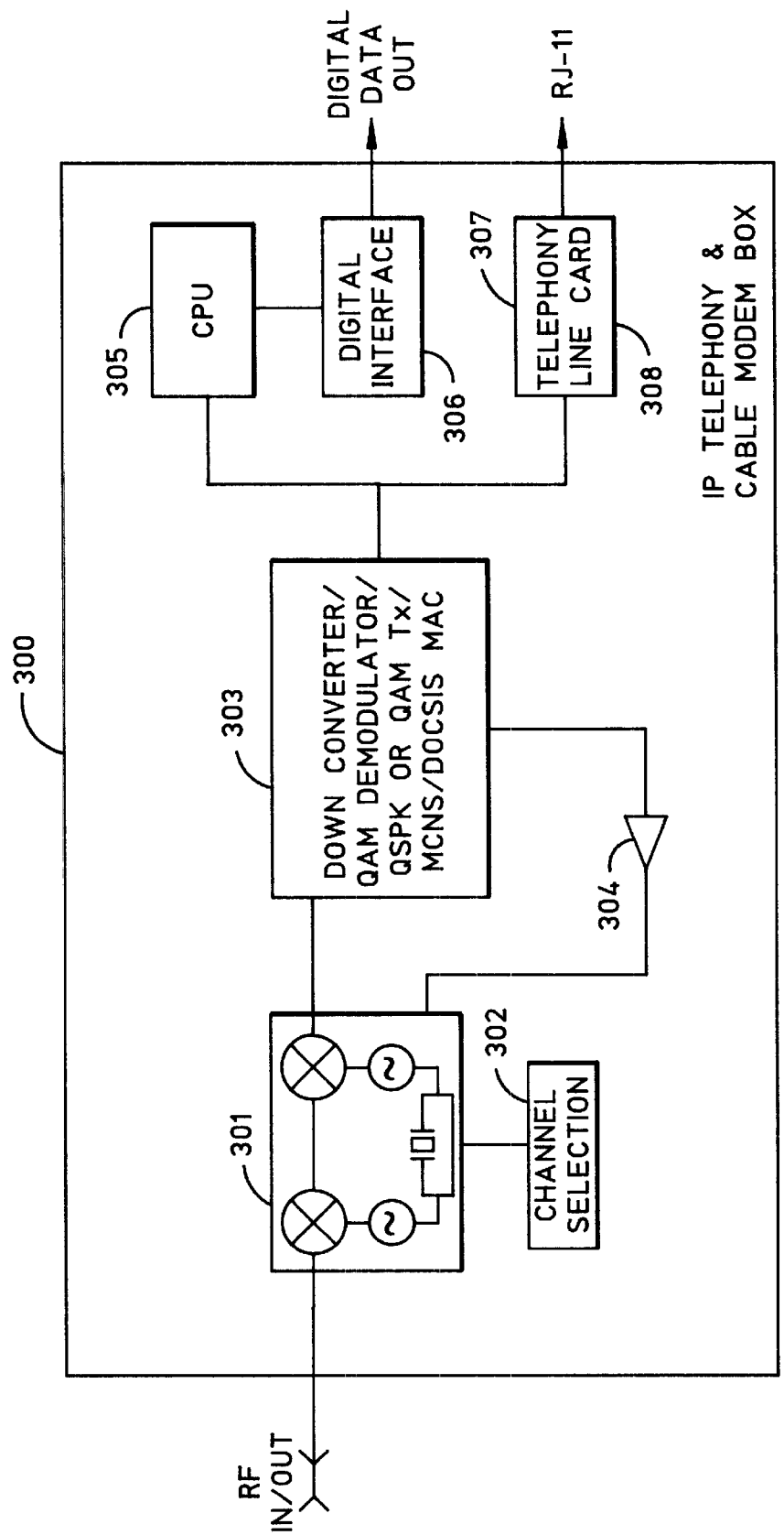
FIG. 11 is a block diagram of an appliance such as an IP (Internet provider) telephone modem box incorporating a double conversion tuner according to the invention.

FIG. 11 illustrates an appliance that may be used, for example, for internet protocol (IP) telephony using a double conversion tuner 310 according to this invention to tune channels that may include, in addition to digital information channels, a telephony channel whose output is provided on a standard RJ-11 telephone connector.

Although the above explanation has described a double conversion tuner, a way to predict spurious signals in the tuner and how to avoid them in the IF output bandwidth of the tuner, it will be understood that various changes, substitutions and alterations may made to this invention and it is intended that the appended claims cover all such modifications as fall within the true spirit and scope of the invention.

We claim:

1. A method for use with a double conversion tuner that generates a first intermediate frequency (IF) signal in response to an input signal and a first local oscillator (LO) signal, generates a second IF signal in response to the first IF signal and a second LO signal, and generates the first and second LO signals in response to a crystal reference frequency, the method for eliminating spurious signals in an IF output bandwidth of the tuner, said method comprising the steps of:

selecting a crystal reference frequency that generates spurious signals only outside of the IF output bandwidth; and, (i) using two or more frequency values to determine a frequency of the first IF signal;

(ii) identifying spurious signals produced by the first IF signal at the determined frequency; and (iii) if no spurious signals produced by the first IF signal at the determined frequency are in the IF output bandwidth, setting the first IF signal to the determined frequency; otherwise (iv) repeating steps (i)–(iii).

2. The method of claim 1 wherein, in step (i), the frequency of the first IF signal is determined as the frequency of the first LO signal minus a video channel frequency (Fv).

3. The method of claim 1 wherein, in step (i), the frequency of the first IF signal is determined as the frequency of the second LO signal plus a channel video frequency.

4. The method of claim 2 or claim 3 wherein the tuner comprises a first LO that produces the first LO signal and a first frequency synthesizer responsive to the crystal reference frequency and connected to the first LO, step (iii) including setting the first frequency synthesizer to operate the first LO at the frequency of the first LO signal.

5. The method of claim 4 wherein the tuner comprises a LO that produces the second LO signal and a second frequency synthesizer responsive to the crystal reference frequency and connected to the first LO, step (iii) including setting the second frequency synthesizer to operate the second LO frequency that sets the frequency of the second LO signal.

6. The method of claim 1 wherein the crystal reference frequency is selected to be 12 MHz.

7. The method of claim 1, Wherein the IF output bandwidth is from 41 MHz to 47 MHz, and the crystal reference frequency is selected to be 12 MHz.

* * * * *